United States Patent [19]

Gonoi

[11] Patent Number: 4,752,701

[45] Date of Patent: Jun. 21, 1988

[54] DIRECT COUPLED SEMICONDUCTOR LOGIC CIRCUIT

[75] Inventor: Katsuaki Gonoi, Kanagawa, Japan

[73] Assignee: Sony Corporation, Tokyo, Japan

[21] Appl. No.: 65,149

[22] Filed: Jun. 12, 1987

Related U.S. Application Data

[63] Continuation of Ser. No. 790,945, Oct. 24, 1985, abandoned.

[30] Foreign Application Priority Data

Nov. 21, 1984 [JP] Japan ................................ 59-246842

[51] Int. Cl.$^4$ .................. H03K 19/017; H03K 19/12; H03K 3/33; H03K 5/08
[52] U.S. Cl. .................................... 307/448; 307/443; 307/460; 307/559; 307/561; 307/280
[58] Field of Search ................. 307/200 B, 443, 446, 307/448, 460, 559, 561, 551, 297, 280, 319

[56] References Cited

U.S. PATENT DOCUMENTS

| | | | |
|---|---|---|---|
| 3,157,795 | 11/1964 | Pressman | 307/280 |
| 3,742,250 | 6/1973 | Kan | 307/237 |
| 4,129,792 | 12/1978 | Kawagai et al. | 307/200 B |
| 4,491,747 | 1/1985 | Shimizu | 307/443 |

FOREIGN PATENT DOCUMENTS

| | | | |
|---|---|---|---|
| 0083181 | 6/1983 | European Pat. Off. | |
| 57-62632 | 4/1982 | Japan | |
| 0231921 | 12/1984 | Japan | 307/448 |
| 1572797 | 8/1980 | United Kingdom | 307/458 |

OTHER PUBLICATIONS

8107 IEEE Jnal of Solid-State Circuits, vol. SC-16 (1981) Oct., No. 5, "Silicon MESFET Digital Circuit Techniques" Cornelis D. Hartgring et al, pp. 578-584.
"Electronic Circuit", Fumio Mizuno, No. 54-47471, vol. 3, No. 67 (E-116), Jun. 9, 1979.

Primary Examiner—John S. Heyman
Assistant Examiner—M. R. Wambach
Attorney, Agent, or Firm—Hill, Van Santen, Steadman & Simpson

[57] ABSTRACT

In a semiconductor logic circuit, a plurality of gates are provided, each formed of a junction type field effect transistor. The junction type field effect transistor of one of the gates is directly coupled to the junction type field effect transistor of a succeeding gate. An element is provided for clamping an output voltage of the junction type field effect transistor of the one gate, which provides an input voltage for the junction type field effect transistor of the succeeding gate, to below about a forward voltage of a pn junction of the succeeding gate.

9 Claims, 2 Drawing Sheets

DIRECT COUPLED SEMICONDUCTOR LOGIC CIRCUIT

This is a continuation of application Ser. No. 790,945, filed Oct. 24, 1985.

BACKGROUND OF THE INVENTION

The present invention relates to a semiconductor circuit apparatus formed of a direct coupled FET logic circuit (DCFL) by using a gate having a junction type field effect transistor (J-FET).

A DCFL requires only a small number of elements for forming a gate and thus is suitable for providing a large scale logic circuit.

FIG. 1 shows an example of a conventional DCFL. In this conventional DCFL, two inverters 11 and 21 are directly coupled. The inverters 11 and 21 consist of J-FETs 12 and 22 using GaAs semiconductors and resistors 13 and 23, respectively. With this arrangement, the OFF-resistance of the J-FET 12 is normally considerably higher than the resistance of the resistor 13 so that the high level of an output voltage of the J-FET 12, i.e., an input voltage to J-FET 22, is substantially the same as the voltage (VDD) of a drive power source (not shown).

When a ring oscillator is formed by a DCFL as described above and propagation delay time ($\tau pd$) per gate is measured, $\tau pd$ is gradually increased in accordance with the increase in the voltage VDD as shown by the solid line in FIG. 2. In constrast to this, when Schottky barrier type field effect transistors (MESFETs) are used in place of the J-FETs 12 and 22, $\tau pd$ is kept constant even if the voltage VDD is increased, as shown by the dotted line in FIG. 2.

This is assumed to be caused by a carrier storage effect of a channel, or a substrate of the J-FET 22 is enhanced as the high level input voltage of the J-FET 22 which becomes higher than a forward voltage (Vf=1.0 V) at a pn junction.

Therefore, in a conventional example as mentioned above, when the voltage VDD is set to be, e.g., higher than 1.5 V, $\tau pd$ as well as power consumption will be increased, resulting in a great disadvantage.

For this reason, the voltage VDD must be set in a range of, e.g., 1.0 to 1.4 V, and the setting condition of the voltage VDD becomes critical. In addition, in some J-FETs, the voltage VDD rapidly increases from the vicinity of 1.2 V, depending upon a condition of the substrate. In this case, the setting condition of the voltage VDD becomes more strict. In other words, only a small margin against variation in the voltage VDD is allowable, this resulting in difficult circuit design.

SUMMARY OF THE INVENTION

It is an object of the present invention to provide a semiconductor circuit apparatus of a simple circuit design, wherein the propagation delay time is not increased upon variation in voltage of a drive power source, and thus a margin for variation in the voltage of the drive power source is large.

In a semiconductor circuit apparatus according to the present invention, an output voltage of a J-FET of a preceding gate which serves as an input voltage to a J-FET of a succeeding gate is limited to below about a forward voltage of a pn junction, so that even if a voltage of a drive power source varies, a carrier storage effect does not conspicuously appear at a J-FET of the succeeding gate.

DESCRIPTION OF THE PREFERRED EMBODIMENTS

Semiconductor circuit apparatuses according to first and second embodiments of the present invention, as applied to two-stage inverters, will be described with reference to FIGS. 3 and 4.

Figure 3:
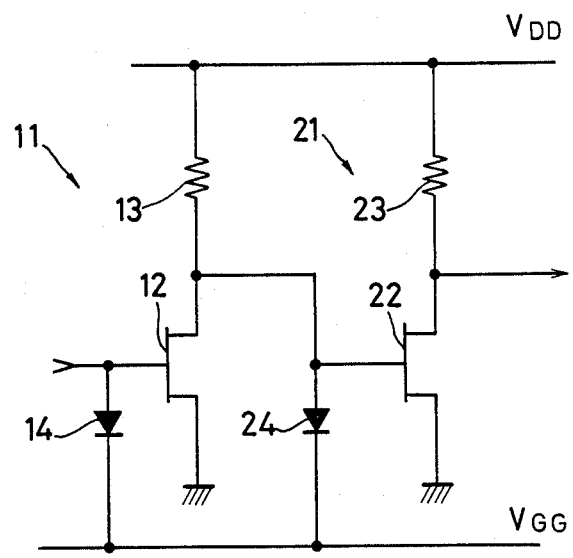
FIGS. 3 and 4 show circuit configurations of semiconductor circuit apparatuses according to first and second embodiments of the present invention.
Figure 4:
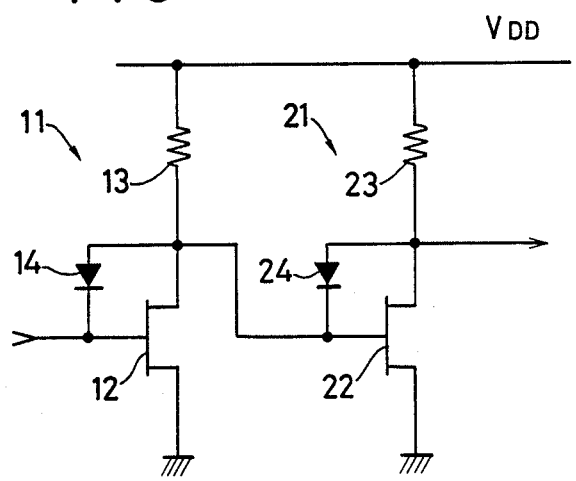

FIG. 3 shows the first embodiment of the present invention. The apparatus of the first embodiment can have substantially the same configuration and is connected to a potential $V_{DD}$ (first voltage potential) as the conventional one shown in FIG. 1 except that gate terminals of J-FETs 12 and 22 in FIG. 3 are connected to a clamping power source (second voltage potential) (not shown) through Schottky barrier diodes (SBD) 14 and 24.

Although it varies a little depending upon the types of metal forming the Schottky barrier, a forward bias voltage Vf of the SBDs 14 and 24 is generally about 0.6 V. When a voltage higher than 0.6 V is applied in the forward direction, a current flows in the SBDs 14 and 24.

When a voltage (VGG) (second voltage potential) of a clamping power source is set to about 0.4 V, and input voltage to the J-FET 22 is maintained at about 1.0 V as long as the SBD 24 has a sufficient current capacity. In other words, when the voltage VDD is increased and the output voltage of the J-FET 12 almost exceeds 1.0 V, the current flows in the SBD 24 so that the output voltage of the J-FET 12, i.e., the input voltage to the J-FET 22, is controlled to be about 1.0 V.

As a result, even if the voltage VDD is increased, the input voltage to the J-FET 22 is controlled to below about Vf of the pn junction. Then, the carrier storage effect does not notably occur at the J-FET 22 and the propagation delay time $\tau pd$ of the inverter 21 is not increased.

In the first embodiment, a gate terminal of the J-FET 12 is also connected to the clamping power source through the SBD 14. Therefore, even when the input voltage to the J-FET 12 almost exceeds 1.0 V, a current flows in the SBD 14 so that the input voltage is controlled to be about 1.0 V. As a result, the carrier storage effect does not notably occur at the J-FET 12, thereby preventing an increase in $\tau pd$ of the inverter 11.

Figure 1:
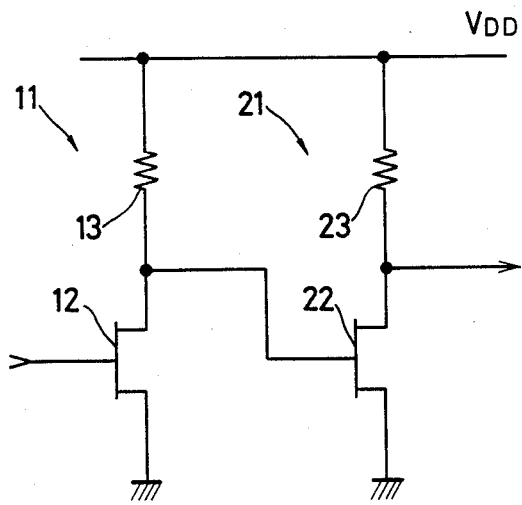
FIG. 1 shows a circuit configuration of an example of a conventional semiconductor circuit apparatus.
Figure 2:
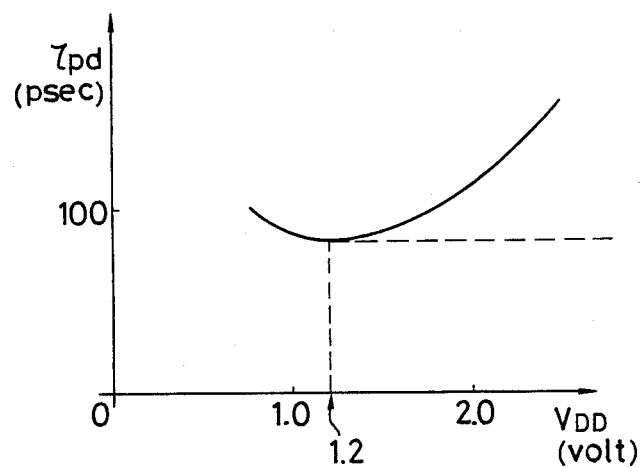
FIG. 2 is a graph showing a propagation delay time of the conventional semiconductor circuit apparatus.

FIG. 1 shows a second embodiment of the present invention. The apparatus of the second embodiment can have substantially the same configuration as the first embodiment shown in FIG. 3, except that in FIG. 4, a clamping power source is not provided and SBDs 14 and 24 are connected between drain terminals and gate terminals of FETs 12 and 22, respectively. The low level of an input voltage to the J-FET 12 is set to 0.2 V, and Vf of the SBDs 14 and 24 is set to 0.7 V.

According to the second embodiment, even when the voltage VDD is increased and the output voltage of the J-FET 12 almost exceeds 0.9 V, a current flows in the SBD 14 so that the output voltage of the J-FET 12, i.e. the input voltage to the FET 22, is controlled to be 0.9 V. Then, the carrier storage effect does not notably occur at the J-FET 22 and the propagation delay time $\tau$pd of the inverter 21 is not increased.

In the second embodiment, the SBD 24 is connected between the drain and gate terminals of the J-FET 22. Therefore, even when the output voltage of the J-FET 22 almost exceeds 0.9 V, a current flows in the SBD 24 to control the output voltage to about 0.9 V.

The apparatus according to the second embodiment does not require a clamping power source and thus has a much simpler circuit design. However, the voltage Vf of SBDs 14 and 24 directly determines a logic amplitude, i.e., the difference between the high and low level output voltages. In order to increase the logic amplitude, it is preferable to set the voltage Vf of the SBDs 14 and 24 to be larger than the voltage Vf in the first embodiment, as has been described above.

Even if the voltage Vf of the SBDs 14 and 24 is positively increased, the high level output voltage of the J-FET 12 can be controlled to be about the voltage Vf of the pn junction by decreasing the low level input voltage of the J-FET 12 and simultaneously increasing the voltage VDD. Therefore, operation conditions can be determined without increasing $\tau$pd.

The high level of the output voltage of the J-FET 12, i.e. the input voltage to the J-FET 12, is controlled both in the first and second embodiments. However, a low level of these voltages is determined in accordance with a ratio of a resistance of the resistor 13 to an on resistance of the J-FET 12. Therefore, the low level can be determined independently of the high level.

In the first and second embodiments, the SBDs 24 and 14 are used as elements for clamping the output voltage of the J-FET 12 so as to allow high-speed operation of the J-FETs 12 and 22 using GaAs. Therefore, when a high-speed operation is not needed, junction diodes and the like can be used in place of the SBDs 24 and 14.

The resistors 13 and 23 as passive elements are used in the first and second embodiments as loads for the inverters 11 and 21. However, FETs or other devices as active elements can be used instead.

The first and second embodiments of the present invention are applied to double-stage inverters. However, the present invention can be applied to a gate other than an inverter.

As has been mentioned above, according to the semiconductor circuit apparatus of the present invention, the carrier storage effect does not occur significantly at a J-FET of a succeeding gate, even if the voltage of a drive power source varies. Therefore, the propagation delay time is not increased due to a variation in voltage of the drive power source.

Since the propagation delay time is not increased by a variation in voltage of the drive power source, a margin for the variation in voltage of the drive power source becomes large, resulting in simple circuit design.

Although various minor changes and modifications might be proposed by those skilled in the art, it will be understood that I wish to include within the claims of the patent warranted hereon all such changes and modifications as reasonably come within my contribution to the art.

I claim as my invention:

1. A semiconductor circuit, comprising:
first and second junction type field effect transistors, each transistor having a channel and a pn junction gate;

the two junction type field effect transistors being directly coupled to each other, a first potential applied through a load to one end of the channel of each transistor, the other end of the channel of each transistor being connected to a reference potential, the pn junction gate of the second transistor being directly connected to a junction between the load and channel of the first transistor, an input of the circuit being connected to the gate of the first transistor and an output of the circuit being connected to a point between the load and channel of the second transistor; and clamping means connected to said junction between the load and channel of said first transistor for clamping an output voltage of the first junction type field effect transistor which outputs an input voltage to the second junction type field effect transistor such that said input voltage is below about a forward voltage of said pn junction of said second transistor so that for increases of the first potential, a propagation delay time of the second transistor is kept substantially constant.

2. A circuit according to claim 1 wherein said clamping means comprises a diode connected between a gate terminal of said second junction type field effect transistor and a clamping power source.

3. A circuit according to claim 1 wherein said clamping means comprises a diode connected between a drain terminal and a gate terminal of the second junction type field effect transistor.

4. A circuit according to claim 1 wherein each of said gates comprises an inverter.

5. A semiconductor circuit, comprising:
a first junction type field effect transistor (J-FET) having one end of its channel connecting through a load impedance to a first voltage potential and an opposite end of the channel connecting to a reference potential;

a second J-FET having one end of its channel connecting through a load impedance to said first voltage potential and an opposite end of its channel connecting to said reference potential, an output of the circuit being provided at a junction of the load impedance and said second J-FET;

a pn junction gate of the second J-FET being directly connected at a junction of the load impedance and first J-FET;

a pn junction gate of the first J-FET being an input of the circuit;

a first Schottky barrier diode having its anode connected to the gate of the first J-FET and its cathode connected to a second voltage potential above the reference potential;

a second Schottky barrier diode having its anode connected to the gate of the second J-FET and its cathode connected to the second voltage potential; and the second voltage potential having a value selected such that a voltage applied to the pn junction gate of the second J-FET does not exceed a forward voltage of the second J-FET gate pn junction so that a propagation delay time of the second J-FET is not increased given increases in the first voltage potential.

6. A semiconductor circuit, comprising:

a first junction type field effect transistor (J-FET) having one end of its channel connecting through a load impedance to a first voltage potential and an opposite end of the channel connecting to a reference potential;

a second J-FET having one end of its channel connecting through a load impedance to said first voltage potential and an opposite end of its channel connecting to said reference potential, an output of the circuit being provided at a junction of the load impedance and said second J-FET;

a pn junction gate of the second J-FET being directly connected at a junction of the load impedance and first J-FET;

a pn junction gate of the first J-FET being an input of the circuit;

a first Schottky barrier diode having its anode connected to the gate of the first J-FET and its cathode connected to a second voltage potential above the reference potential;

a second Schottky barrier diode having its anode connected to the gate of the second J-FET and its cathode connected to the second voltage potential;

the second voltage potential having a value selected such that a voltage applied to the pn junction gate of the second J-FET does not exceed a forward voltage of the second J-FET gate pn junction so that a propagation delay time of the second J-FET is not increased given increases in the first voltage potential; and the Schottky barrier diode having a forward turn-on voltage of approximately 0.6 volts and the second voltage potential being approximately 0.4 volts relative to said reference potential.

7. A semiconductor circuit, comprising:

a first junction type field effect transistor (J-FET) having one end of its channel connecting through a load impedance to a first voltage potential and an opposite end of the channel connecting to a reference potential;

a second J-FET having one end of its channel connecting through a load impedance to said first voltage potential and an opposite end of its channel connecting to said reference potential, and an output of the circuit being provided at a junction of the load impedance and said second J-FET;

a pn junction gate of the first J-FET being an input of the circuit;

a first Schottky barrier diode having its cathode connected to the gate of the first J-FET and its anode connected to said one end of the channel of the first J-FET, and a second Schottky barrier diode having its cathode connected to the gate of the second J-FET and its anode connected to said one end of the channel of the second J-FET; and a low level of an input voltage at said input having a value selected such that a voltage applied to the pn junction gate of the second J-FET does not exceed a forward voltage of the second J-FET gate pn junction so that a propagation delay time of the second J-FET is not increased given an increase in the first voltage potential.

8. A semiconductor circuit, comprising:

a first junction type field effect transistor (J-FET) having one end of its channel connecting through a load impedance to a first voltage potential and an opposite end of the channel connecting to a reference potential;

a second J-FET having one end of its channel connecting through a load impedance to said first voltage potential and an opposite end of its channel connecting to said reference potential, an output of the circuit being provided at a junction of the load impedance and said second J-FET;

a pn junction gate of the second J-FET being directly connected at a junction of the load impedance and first J-FET;

a pn junction gate of the first J-FET being an input of the circuit; and a first diode having its anode connected to the gate of the first J-FET and its cathode connected to a second voltage potential, a second diode having its anode connected to the gate of the second J-FET and its cathode connected to the second voltage potential, the second voltage potential having a value chosen so as to clamp an input voltage between the gate and the opposite end of the second J-FET to approximately 1 volt so that a propagation delay time of the second J-FET is not increased given an increase in the first voltage potential.

9. A semiconductor circuit, comprising:

a first junction type field effect transistor (J-FET) having one end of its channel connecting through a load impedance to a first voltage potential and an opposite end of the channel connecting to a reference potential;

a second J-FET having one end of its channel connecting through a load impedance to said first voltage potential and an opposite end of its channel connecting to said reference potential, and an output of the circuit being provided at a junction of the load impedance and said second J-FET;

a pn junction gate of the second J-FET being directly connected at a junction of the load impedance and first J-FET;

a pn junction gate of the first J-FET being an input of the circuit; and a first diode having its cathode connected to the gate of the first J-FET and its anode connected to said one end of the channel of the first J-FET, a second diode having its cathode connected to the gate of the second J-FET and its anode connected to said one end of the channel of the second J-FET, and a low level of an input voltage at said input having a value chosen so as to clamp an input voltage between the gate and the opposite end of the channel of the second J-FET to approximately 0.9 volt so that a propagatin delay time of the second J-FET does not increase given an increase of the firt voltage potential.

* * * * *